United States Patent
Nagase (10) Patent No.: US 10,348,294 B2
(45) Date of Patent: Jul. 9, 2019

(54) POWER TRANSISTOR DRIVING APPARATUS

(71) Applicant: DENSO CORPORATION, Kariya, Aichi-pref. (JP)

(72) Inventor: Takuo Nagase, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/570,399

(22) PCT Filed: May 12, 2016

(86) PCT No.: PCT/JP2016/002331
§ 371 (c)(1),
(2) Date: Oct. 30, 2017

(87) PCT Pub. No.: WO2016/189817
PCT Pub. Date: Dec. 1, 2016

(65) Prior Publication Data
US 2018/0138904 A1    May 17, 2018

(30) Foreign Application Priority Data
May 22, 2015  (JP) ................. 2015-104623

(51) Int. Cl.
*H01L 27/06* (2006.01)
*H03K 17/567* (2006.01)
(Continued)

(52) U.S. Cl.
CPC .......... *H03K 17/567* (2013.01); *H01L 23/34* (2013.01); *H01L 27/0623* (2013.01); *H02M 1/08* (2013.01);
(Continued)

(58) Field of Classification Search
CPC .. H03K 17/567; H03K 17/122; H03K 17/127; H03K 17/0406; H03K 17/164
See application file for complete search history.

(56) References Cited

U.S. PATENT DOCUMENTS

| | | | | | |
|---|---|---|---|---|---|
| 5,786,973 | A | * | 7/1998 | Majumdar | ........... H02H 7/1206 307/86 |
| 2007/0284664 | A1 | * | 12/2007 | Okuda | .................... H01L 23/34 257/355 |

(Continued)

FOREIGN PATENT DOCUMENTS

| JP | 2005-295653 A | 10/2005 |
|---|---|---|
| JP | 2009-142070 A | 6/2009 |

(Continued)

*Primary Examiner* — Jaehwan Oh
(74) *Attorney, Agent, or Firm* — Posz Law Group, PLC (57) ABSTRACT

A power transistor driving apparatus includes: a field-effect type transistor; an insulated gate type bipolar transistor, which is connected to the field-effect type transistor in parallel; a first driving circuit generating a first gate voltage to turn on the insulated gate type bipolar transistor, the first gate voltage applied to a gate of the insulated gate type bipolar transistor; a second driving circuit adjusting a second gate voltage to turn on or off the field-effect type transistor, the second gate voltage applied to a gate of the field-effect type transistor; a detection circuit detecting whether the insulated gate type bipolar transistor is turned on when the first driving circuit generates the first gate voltage. The second driving circuit generates the second gate voltage to turn on the field-effect type transistor when the detection circuit detects that the insulated gate type bipolar transistor is turned on.

10 Claims, 4 Drawing Sheets

(51) Int. Cl.
- *H02M 1/08* (2006.01)
- *H03K 17/08* (2006.01)
- *H01L 23/34* (2006.01)
- *H02M 1/32* (2007.01)
- *H03K 17/18* (2006.01)
- *H03K 17/082* (2006.01)
- *H03K 17/12* (2006.01)

(52) U.S. Cl.
CPC .............. *H02M 1/32* (2013.01); *H03K 17/08* (2013.01); *H03K 17/0822* (2013.01); *H03K 17/0828* (2013.01); *H03K 17/127* (2013.01); *H03K 17/18* (2013.01)

(56) References Cited

U.S. PATENT DOCUMENTS

| | | | | |
|---|---|---|---|---|
| 2012/0235710 A1* | 9/2012 | Roessler | ............. | H03K 17/567 327/109 |
| 2012/0307540 A1* | 12/2012 | Tagome | ................ | H02M 1/088 363/131 |
| 2013/0062626 A1* | 3/2013 | Takao | .................. | H03K 17/127 257/77 |
| 2013/0147525 A1* | 6/2013 | Takagiwa | ............. | H03K 17/163 327/109 |
| 2013/0155745 A1 | 6/2013 | Tanaka et al. | | |
| 2013/0257177 A1* | 10/2013 | Jacobson | ................ | H02M 1/08 307/115 |
| 2014/0320178 A1* | 10/2014 | Hosini | ............. | H03K 17/08128 327/109 |
| 2015/0180453 A1* | 6/2015 | Mori | ..................... | H02M 1/088 327/109 |

FOREIGN PATENT DOCUMENTS

| | | |
|---|---|---|
| JP | 2011-055663 A | 3/2011 |
| JP | 2012-253202 A | 12/2012 |

* cited by examiner

POWER TRANSISTOR DRIVING APPARATUS

CROSS REFERENCE TO RELATED APPLICATIONS

This application is a U.S. national stage of International Patent Application No. PCT/JP2016/002331 filed on May 12, 2016 and is based on Japanese Patent Application No. 2015-104623 filed on May 22, 2015, the disclosures of which are incorporated herein by reference.

TECHNICAL FIELD

The present disclosure relates to a power transistor driving apparatus that drives an insulated gate type bipolar transistor and a field-effect type transistor, which are connected in parallel.

BACKGROUND ART

For example, Patent Literature 1 illustrates a configuration where an insulated gate type bipolar transistor (hereinafter referred to as "IGBT") and a field-effect type transistor (hereafter referred to as "FET") are connected in parallel. In the invention of Patent Literature 1, in order to miniaturize the FET or the whole device, it is configured that the entire current flows through the IGBT side at the transient state during switching. In particular, it is configured that the IGBT is initially turned on and subsequently the FET is turned on during the turn on. In addition, it is configured that IGBT is turned off after the FET is turned off during the turn off.

Patent Literature 1 describes several techniques to shift the on-state timing and off-state timing of the IGBT and FET. The first technique is to set the threshold voltage of the IGBT to be lower than the threshold voltage of the FET, It is noted that the setting of the threshold voltage is performed by the channel injection amount of impurity during the manufacturing. The second technique is to set the value of the gate interconnection resistor of the FET to be larger than the value of the gate interconnection resistor of the IGBT; and to connect a diode to the gate interconnection resistor of the FET in an anti-parallel manner. The third technique is to connect each of the IGBT and MOSFET to a gate control circuit; and to produce a time difference between the generation of a gate control signal provided to the IGBT and the generation of a gate control signal provided to the FET.

However, with regard to any of the techniques described in Patent Literature 1, it is difficult to take an adequate longer time for the on-timing of the FET, and therefore, the effect of reducing transmission loss, which is caused by the FET, may not be achieved. For example, in a case of the above second technique, the shift of the on-timing of the IGBT and the on-timing of the FET is caused by the variance between the respective capacitances and the variance between the respective values of the gate interconnection resistors. With these variances, it is required to make a margin so as to turn on the FET after the IGBT is switched into a constant state (a saturation state) even when the on-timing of the IGBT makes its closest approach to the on-timing of the FET. Accordingly, the timing for turning on FET has to be set later by the margin and the on-timing of the FET becomes shorter as a result.

PRIOR ART LITERATURES

Patent Literature

Patent Literature 1: JP 2013-125806 A

SUMMARY OF INVENTION

It is an object of the present disclosure to provide a power transistor driving apparatus that quickly turns on a field-effect type transistor after an insulated gate type bipolar transistor is turned on.

A power transistor driving apparatus according to an aspect of the present disclosure includes: a field-effect type transistor; an insulated gate type bipolar transistor, which is connected to the field-effect type transistor in parallel; a first driving circuit that generates a first gate voltage to turn on the insulated gate type bipolar transistor, the first gate voltage applied to a gate of the insulated gate type bipolar transistor; a second driving circuit that adjusts a second gate voltage to turn on or off the field-effect type transistor, the second gate voltage applied to a gate of the field-effect type transistor; a detection circuit that detects whether the insulated gate type bipolar transistor is turned on when the first driving circuit generates the first gate voltage. The second driving circuit generates the second gate voltage to turn on the field-effect type transistor based on a condition in which the detection circuit detects that the insulated gate type bipolar transistor is turned on.

Accordingly, it is possible to turn on the field-effect type transistor as early as possible after the insulated gate type bipolar transistor is turned on. On the other hands, when the insulated gate type bipolar transistor is turned off; or when the insulated gate type bipolar transistor is not completely turned off, since the second driving circuit does not generate a gate voltage for turning on the field-effect type transistor, it can be prevented that the field effect type transistor is turned on when the insulated gate type bipolar transistor is not turned on.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

The following describes an embodiment of a power transistor driving apparatus according to the present disclosure in detail with reference to drawings. it is noted that a power transistor to be driving by a power transistor driving apparatus in each embodiment described in the following may also be used under a large voltage or a large current, and therefore, it may also be used as a switching element in, for example, an inverter, a converter, a jumper as a power converter.

First Embodiment

Figure 1:
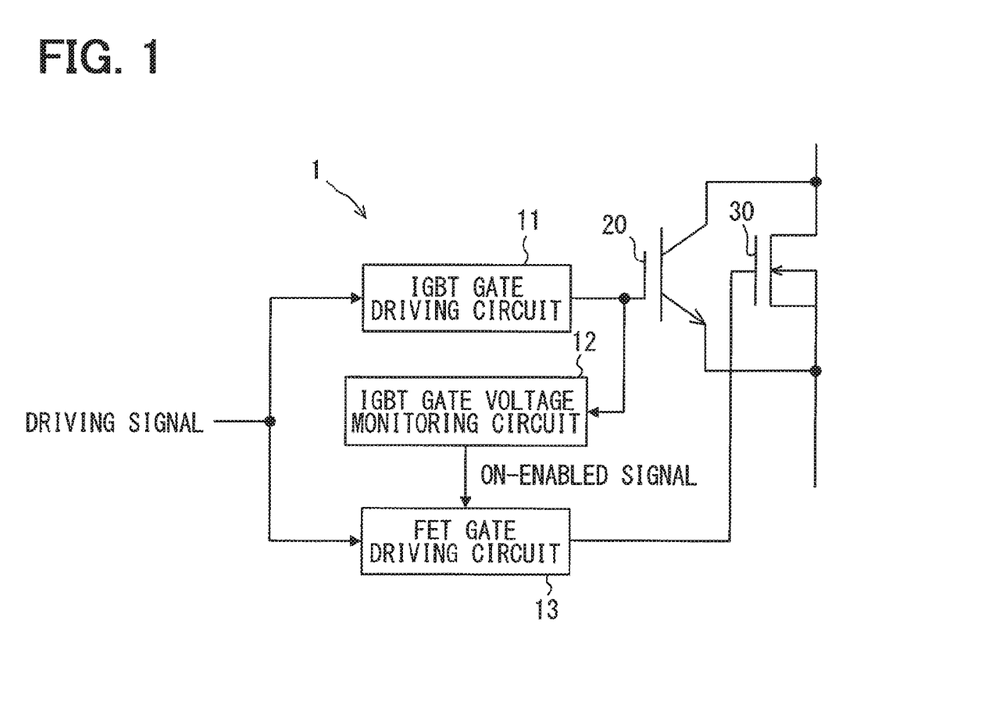
FIG. 1 is a drawing that shows a configuration of a power transistor driving apparatus according to a first embodiment.
Figure 2:
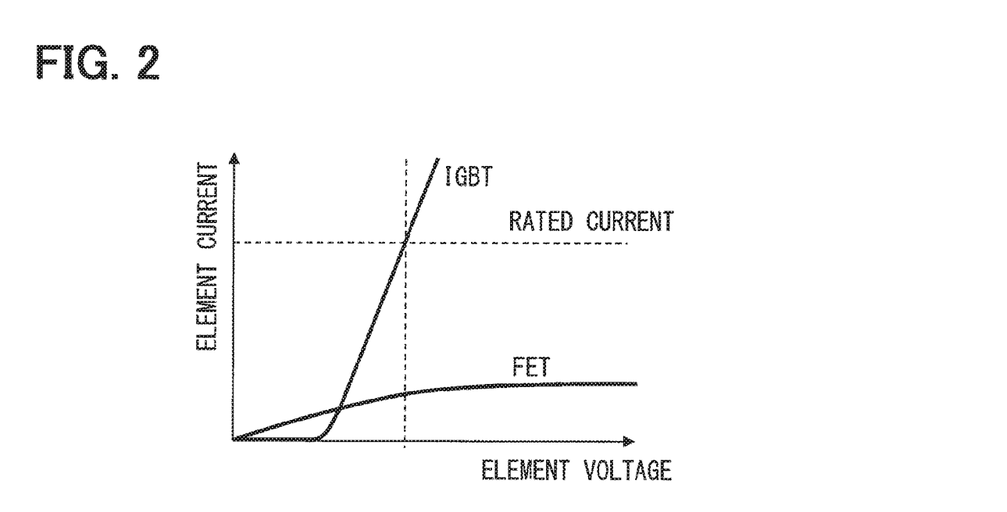
FIG. 2 is a drawing that illustrates a graph showing the relation between the emitter-collector voltage of an IGBT and the source-drain voltage of the FET, and the relation between the collector current of the IGBT and the drain current of the FET.

A power transistor driving apparatus 1 according to a first embodiment is described with reference to FIGS. 1 to 3. In the present embodiment, a power transistor includes an insulated gate type bipolar transistor 20 (hereinafter referred to as IGBT) and a field-effect type transistor 30 (hereinafter referred to as FET), which is connected to the IGBT 20 in parallel. In other words, the emitter of the IGBT 20 is connected to the source of the FET 30, and the collector of the IGBT 20 is connected to the drain of the FET 30. It is noted that other devices such as MOSFET, JFET and HEMT may also be used as the FET 30.

An IGBT gate driving circuit 11 for generating a voltage applied to the gate of the IGBT 20 is connected to the gate of the IGBT 20 to turn on or off the IGBT 20 according to a driving signal provided from outside.

An FET gate driving circuit 13 is connected to the gate of the FET 30 to adjust a gate voltage applied to the gate of the FET 30 based on the driving signal and an on-enabled signal to be outputted from the after-mentioned IGBT voltage monitoring circuit 12.

Moreover, the power transistor driving apparatus 1 in the present embodiment includes an IGBT gate voltage monitoring circuit 12 to monitor a gate voltage to be applied to the gate of the IGBT 20. By the voltage generated in the IGBT gate driving circuit 11, the IGBT gate voltage monitoring circuit 12 outputs an on-enabled signal to the FET gate driving circuit 13 considering a situation in which the IGBT 20 is turned on, in other words, the IGBT 20 reaches a constant state (saturation state) when a voltage more than or equal to the predetermined voltage is applied to the gate of the IGBT 20. Accordingly, the predetermined voltage is set at a value to be higher than the value of the on-threshold voltage of the IGBT 20.

Therefore, the IGBT gate voltage monitoring circuit 12 monitors a voltage applied to the gate of the IGBT 20, and detects the situation in which the IGBT 20 is switched to an on-state when the applied voltage is larger than or equal to the predetermined voltage. Accordingly, the IGBT gate voltage monitoring circuit 12 detects whether the IGBT 20 is turned on.

Conventionally, for example, a p+ layer is added to the drain side of the n-channel MOSFET. Accordingly, when the IGBT 20 is turned on, the conductivity modulation, which is caused by injection of holes from the added p+ layer to the n− layer (drift layer), occurs and the resistance of the n− later decreases. As a result, it is possible that a large currents flows in the IGBT 20 so that the loss in conduction or the miniaturization of a chip size can be achieved.

As described above, the FET 30 is connected to IGBT 20 in parallel. By turning on the FET 30 and the IGBT 20, the current can be shared by the FET 30 and the IGBT 20 to minimize further conduction loss in the power transistor. In particular, the MOSFET, JFET, or HEMT is configured as the FET 30 to be used with a wide band gap semiconductor such as SiC or GaN for aiming decrease in further loss because of inhibiting conduction loss in the FET 30.

However, the FET 30 is driven by unipolar driving; therefore, it is required to increase a chip size to accept a larger current similar to the one flowing through the IGBT 20. In this situation, the size of the power transistor having the IGBT 20 and the FET 30 has to be enlarged. Accordingly, in the present embodiment, it is configured that, by setting a value of the current through the FET 30 to be smaller than a value of the rated current of the IGBT 20, the chip size of the FET 30 is not required to be enlarged, as illustrated in FIG. 2. It is noted that FIG. 2 illustrates the relation between the emitter-collector voltage of the IGBT 20 and the source-drain voltage of the FET 30, and the relation between the collector current of the IGBT 20 and the drain current of the FET 30.

Thus, in a situation where the current conducted in the FET 30 is made to be smaller than the rated current of the IGBT 20, during the transient state in the turn-on timing or the turn-off timing of the power transistor, an excessive current flows through the FET 30 and damages the FET 30 if the FET 30 is turned on little earlier than the IGBT 20 or if the FET 30 is turned off little earlier than the IGBT 20.

In order to solve this difficulty, although the techniques described in the background art are considered, it is required to set a margin at the timing of turning on the FET 30 and/or the timing of turning off the FET 30 in view of, for example, the variance of the properties of IGBT 20, FET 30 and the each of the gate interconnection resistors. Accordingly, the on-timing of the FET 30 is shorten by delaying the timing of turning on the FET 30 or advancing the timing of turning off the FET 30; and therefore, it is difficult to achieve a remarkable effect of minimizing the transmission loss in the FET 30.

Accordingly, in the present embodiment, it is configured to provide the IGBT gate voltage monitoring circuit 12 to detect the situation of turning on the IGBT 12 based on a voltage applied to the gate of the IGBT 20. Moreover, when it is detected that the IGBT 12 is turned on, the IGBT gate voltage monitoring circuit 12 is configured to output an on-enabled signal to the FET gate driving circuit 13.

The FET gate driving circuit 13 outputs a gate voltage for turning on the FET 30 based on a condition in which an on-enabled signal is outputted from the IGBT gate voltage monitoring circuit 12 in addition to a driving signal for instructing the power transistor to turn on without generating a gate voltage for turning on the FET 30.

According to the power transistor driving apparatus 1 in the present embodiment, it is possible to turn on the FET 30 as early as possible after confirming the situation in which the IGBT 20 is turned on. Accordingly, it is possible to lengthen the time for turning on the FET 30 so that the effect of minimizing the loss caused by the FET 30 can be fully exhibited. On the other hands, when the IGBT 20 is turned off or when the IGBT 20 is not completely turned on, the FET gate driving circuit 13 does not generate a gate voltage for turning on the FET 30, and therefore, it is possible to surely prevent the situation where only the FET 30 is turned on.

During the timing of turning off the power transistor, the FET gate driving circuit 13 terminates the output of a gate voltage to the FET 30 when a driving signal instructs the power transistor to turn off or when the IGBT gate voltage monitoring circuit 12 terminates the output of the on-enabled signal. Accordingly, the FET 30 can be turned off at a proper timing before the IGBT 20 is turned off.

Next, each operation at the timing of turning off the power transistor and at the timing of turning on the power transistor is described in detailed with reference to a waveform diagram in FIG. 3.

At time t1, when a driving signal rises to instruct the power transistor to turn on, the IGBT gate driving circuit 11 starts to output a gate voltage to the IGBT 20. At time t2, a gate voltage applied to the gate of the IGBT 20 rises to the on-threshold voltage of the IGBT 20 and the current (collector current) starts to flow between the emitter and collector in the IGBT 20. In addition, the charging of the gate-emitter capacitance in the IGBT 20 is also carried out.

Figure 3:
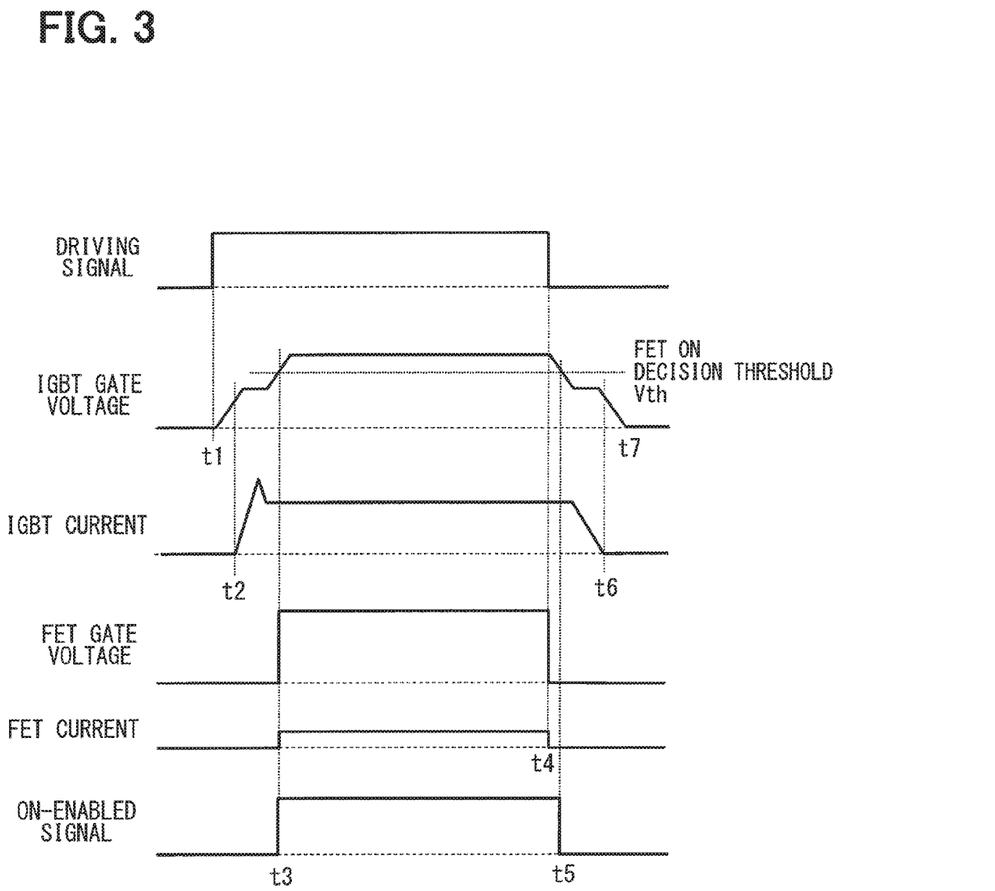
FIG. 3 is a drawing that shows a waveform diagram for illustrating an operation of each unit in a power transistor at the turn-on timing and the turn-off timing.

It is noted that, as illustrated in FIG. 3, subsequent to time t2, the gate voltage of the IGBT 20 is substantially constant in a period. This situation occurs because of the charging of the gate-collector capacitance in the IGBT 20 through a gate voltage. When the charging of the gate-collector capacitance is completed, the gate voltage starts to rise again. The IGBT 20 is switched to a saturation region and is completely in an on state by completing charging the gate-collector capacitance in the IGBT 20.

The IGBT gate voltage continues to rise hereinafter. Subsequently, when the IGBT gate voltage surpasses the FET on-decision threshold voltage Vth, the IGBT gate voltage monitoring circuit 12 outputs an on-enabled signal to the FET gate driving circuit 13 at time t3. Accordingly, the FET on-decision threshold voltage Vth is set to be higher than the on-threshold voltage of the IGBT 20 and further to a higher value after the IGBT 20 is switched to the saturation region.

The FET gate driving circuit 30 starts to output the gate voltage to turn on the FET 30 as illustrated in FIG. 3 according to the reception of the on-enabled signal. In this situation, the IGBT 20 is already turned on and the source-drain voltage of the FET 30 becomes sufficiently lower, a mirror period (a period where the gate voltage is constant) does not occur. Accordingly, the FET 30 is turned on within the shortest time and the current (drain current) starts to flow between the source-drain of the FET 30 when the gate voltage is outputted from the FET gate driving circuit 13. Accordingly, it is possible to minimize the conduction loss in the power transistor substantially when the IGBT 20 and the FET 30 are in an on state after time t3.

At time t4, when the diving signal falls to instruct the power transistor to turn off, the FET gate driving circuit 13 terminates the output of the gate voltage to the FET 30. Thus, the FET 30 is swiftly switched to an off state according to an instruction for turning off the power transistor.

The IGBT gate driving circuit 11 also starts to lower the gate voltage to be outputted to the IGBT 20 according to an instruction of turning off the power transistor at time t4. It is noted that when the IGBT 20 is switched on, a large current flows through the IGBT 20. Accordingly, when the IGBT 20 is turned off with a high speed, it is possible to have a fault such as the occurrence of ringing noise. Thus, the IGBT gate driving circuit 11 lowers the gate voltage gradually in a predetermined time without lowering the gate voltage spontaneously.

At time t5, when a gate voltage applied to the gate of the IGBT 20 becomes lower than the FET on-decision threshold voltage Vth, the IGBT gate voltage monitoring circuit 12 terminates the output of the on-enabled signal. In fact, as described above, the FET gate driving circuit 13 terminates the output of the gate voltage at time t4; however, it is not necessarily that the output of the gate voltage is completed according to the termination of the output of the on-enabled signal from the IGBT gate voltage monitoring circuit 12. However, the FET gate driving circuit 13 may be configured to terminate the output of the gate voltage to the FET 30 based on the termination of the output of the on-enabled signal from the IGBT gate voltage monitoring circuit 12. In this situation, the FET 30 is able to be turned off adequately earlier than the IGBT 20.

Subsequently, the gate voltage to be applied to the gate of the IGBT 20 is further lowered. At time t6, the current does not flow through between the emitter and collector of the IGBT as the gate voltage reaches the on-threshold voltage of the IGBT 20. Subsequently, at time t7, the gate voltage to be applied to the gate of the IGBT 20 becomes zero. As described above, the process of turning off the power transistor is completed. In the operation of turning off the power transistor, the FET 30 is turned off earlier than the IGBT 20 as described above. Accordingly, it can be surely prevented that an excessive current flows through the FET 30 and damages the FET 30.

Second Embodiment

A power transistor driving apparatus 1 according to a second embodiment is described in the following.

In the power transistor driving apparatus 1 according to the above-mentioned first embodiment, the IGBT gate voltage monitoring circuit 12 detects that the IGBT 20 is turned on based on the gate voltage to be applied to the gate of the IGBT 20.

The on-threshold voltage or the on-resistance of the IGBT 20 may be changed due to an ambient temperature. Accordingly, it may be configured to provide a temperature detector (for example, a thermostatic diode) for detecting the temperature of the IGBT 20 in order to accurately detect the situation in which the IGBT 20 is turned on. Then, the IGBT gate voltage monitoring circuit 12 may change the FET on-decision threshold voltage Vth in view of the temperature properties of the on-threshold voltage or the on-resistance of the IGBT 20 based on the temperature detected by the temperature detector.

Third Embodiment

Figure 4:
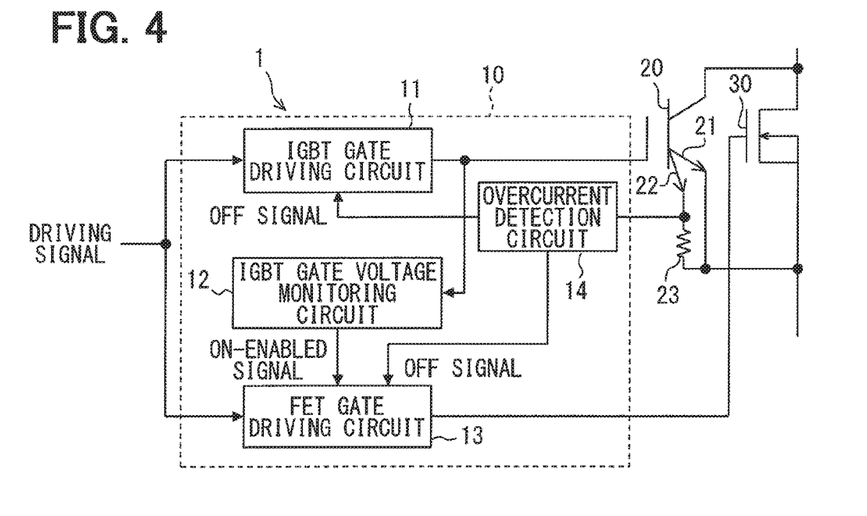
FIG. 4 is a drawing that shows a configuration of a power transistor driving apparatus according to a third embodiment.

A power transistor driving apparatus 1 according to a third embodiment is described in the following. FIG. 4 illustrates a configuration of a power transistor driving apparatus 1 in this embodiment.

The configuration of the power transistor driving apparatus 1 according to this embodiment has several parts which are identical to the ones in the configuration of the power transistor driving apparatus 1 according to the first embodiment. Accordingly, the different parts are described in the following while the descriptions of the identical parts are omitted.

With regard to the first difference, in this present embodiment, the IGBT 20 has a configuration where a plurality of cells are connected in parallel. The plurality of cells are categorized into a high number of main cells 21 and a low number of sense cells 22. The ratio of the main cells 21 to the sense cells 22 is predetermined. Thus, when the IGBT 20 is turned on, the larger amount of the total current flowing between the emitter and collector of the IGBT 20 flows through the main cells 21. However, a predetermined proportion of the current flows through the sense cells 22.

With regard to the second difference, a sense resistor 23 is connected to a path of the current, which flows through the sense cells 22.

Moreover, with regard to the third difference, an overcurrent detection circuit 14 is arranged in the present embodiment. The overcurrent detection circuit 14 inputs a voltage to the terminal of the sense resistor 23 and detects the current flowing through the sense cells 22. In other words, the resistance value of the sense resistor 23 is already known. Accordingly, the overcurrent detection circuit 14 can detect a sense current from the terminal voltage of the sense resistor 23. Furthermore, the overcurrent detection circuit 14 determines whether an overcurrent, which exceeds the rated current, flows between the emitter and collector of the IGBT 20 by comparing the sense current with the predetermined overcurrent decision threshold.

As described above, since a predetermined proportion of the current flowing between the emitter and collector of the IGBT 20 is a sense current, it can be determined that whether the overcurrent is conducted in the IGBT 20 by determining the predetermined overcurrent decision threshold value. It is noted that the overcurrent detection circuit 14 may determine the entire current flowing through the IGBT 20 from the sense current to determine whether the overcurrent is conducted by comparing the whole current with the overcurrent decision threshold value, which is set for other purposes.

When it is determined that the overcurrent is conducted in the IGBT 20, the overcurrent detection circuit 20 outputs an off-state signal to the IGBT gate driving circuit 11. Thus, the IGBT gate driving circuit 11 starts to lower the gate voltage to be outputted to the IGBT 20, which is similar to the similar situation when the driving signal falls as illustrated in FIG. 3. Accordingly, the IGBT 20 is turned off so that the IGBT 20 can be protected from overcurrent.

Moreover, the overcurrent detection circuit 14 outputs an off-state signal to the IGBT gate driving circuit 11, and outputs to the FET gate driving circuit 13 at the same time. Therefore, the FET gate driving circuit 13 outputs an output of the gate voltage to the FET 30 while the driving signal fails. As a result, the FET 30 is promptly shifted to an off state.

Since the overcurrent detection circuit 14 outputs an off-state signal to the FET gate driving circuit 13, the IGBT 20 is initially turned off and then the FET 30 can be surely turned off. In addition, it is not required to separately provide a configuration for protecting the FET 30 from overcurrent.

As described in the first embodiment, when the IGBT gate driving circuit 11 starts to lower the gate voltage, the gate voltage of the IGBT 20 becomes lower than the FET on-decision threshold voltage Vth before the IGBT 20 is turned off. Thus, the IGBT gate voltage monitoring circuit 12 terminates the output of on-enabled signal to the FET gate driving circuit 13. Accordingly, it is possible to turn off the FET 30 earlier than the IGBT even when an off state signal is not directly outputted to the FET gate driving circuit 13 from the overcurrent detection circuit 14.

Fourth Embodiment

A power transistor driving apparatus 1 according to a fourth embodiment is described in the following.

The power transistor driving apparatus 1 according to each of the first to third embodiments controls a large current to conduct or not to conduct with the use of a power transistor. Accordingly, noise caused by current change at the time of switching the power transistor may affect the operation of other circuit.

For example, in FIG. 4, when a variety of circuits 11 to 14 surrounded by a broken line are integrated as a driving IC 10, in a situation where the driving IC 10 and the power transistor (the IGBT 20 and FET 30) are mounted on separate positions, the above-mentioned noise is superimposed on the gate wiring between the driving IC 10 and the power transistor. When the noise is superimposed on the gate wiring, an erroneous operation may occur in the circuits of IC 10 or a power transistor.

Figure 5:
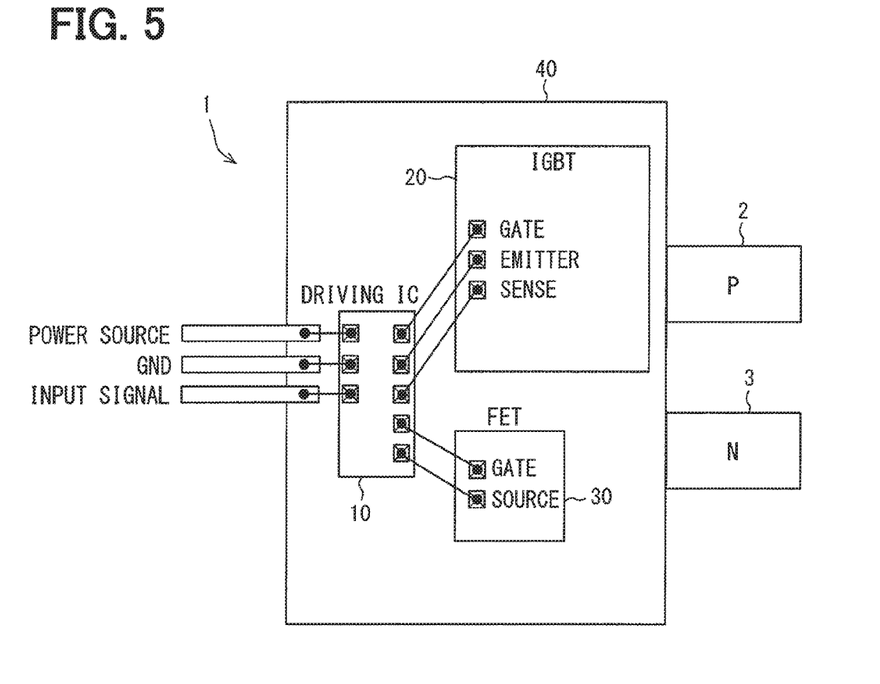
FIG. 5 is a drawing that shows a configuration of a power transistor driving apparatus according to a fourth embodiment.

Accordingly, in the present embodiment, the IGBT gate driving circuit 11, the IGBT gate voltage monitoring circuit 12, the FET gate driving circuit 13 and the overcurrent detection circuit 14 are integrated into the same IC chip as the driving IC 10. Moreover, as shown in FIG. 5, the driving IC 10, the IGBT 20 and the FET 30 are mounted on the same circuit board and sealed in the same package. In FIG. 5, a P-terminal 2 and an N-terminal 3 are respectively illustrated as a power source terminal and a ground terminal respectively connected to a power source and ground.

Therefore, by mounting the driving IC 10, the IGBT 20 and the FET 30 on the same circuit board and packaging them together, it is possible to arrange the driving IC 10 closer to the IGBT 20 and the FET 130. Accordingly, the noise generated by the switching of the power transistor becomes more difficult to be superimposed on the gate wiring so as to inhibit an erroneous operation in the circuits of the driving IC 10 or the power transistor.

Fifth Embodiment

A power transistor driving apparatus 1 according to a fifth embodiment is described in the following.

In the power transistor driving apparatus 1 according to the first embodiment, the IGBT gate voltage monitoring circuit 12 monitors a voltage applied to the gate of the IGBT 20, and detects that the IGBT 20 is turned on when the applied voltage becomes larger than or equal to the FET on-decision threshold voltage Vth. However, the technique for detecting the IGBT 20 being at an on-state is not necessarily to be restricted at monitoring the gate voltage. For example, it may be configured to monitor the current flowing through the IGBT 20 and detects a situation in which the IGBT 20 is turned on according to the detection of the current flowing though the IGBT 20 being larger than or equal to the predetermined current.

Figure 6:
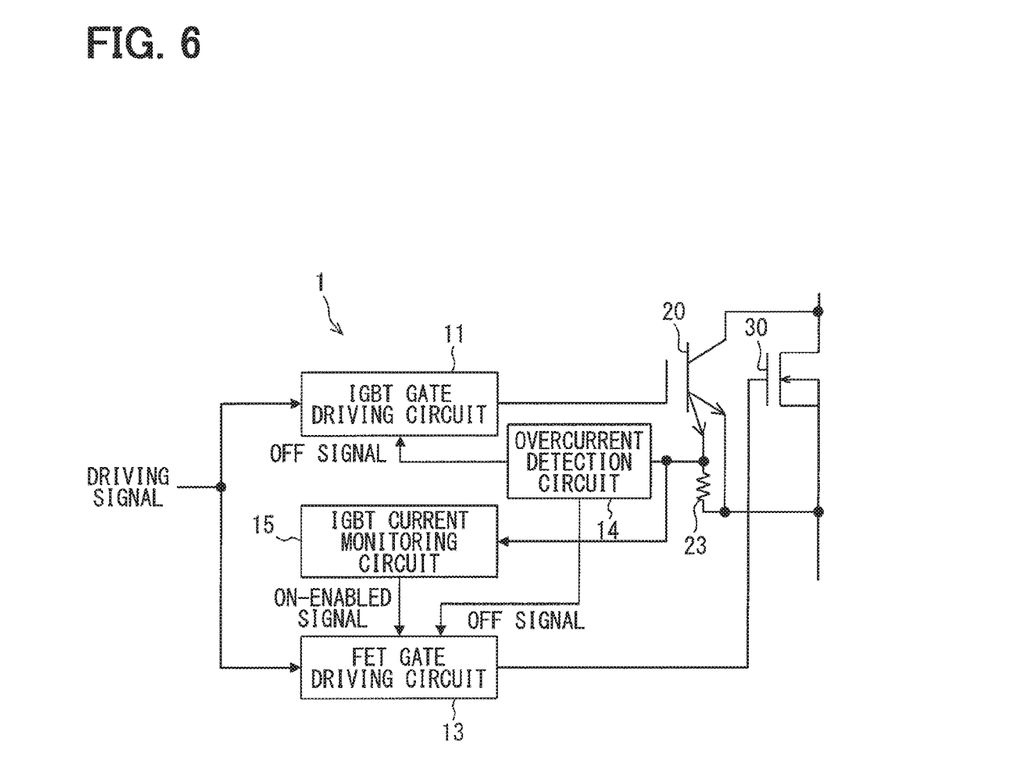
FIG. 6 is a drawing that shows a configuration of a power transistor driving apparatus according to a fifth embodiment.

FIG. 6 illustrates a configuration of a power transistor driving apparatus 1 according to fifth embodiment for detecting the IGBT 20 being turned on based on the magnitude of the current flowing through the IGBT 20.

As illustrated in FIG. 6, the power transistor driving apparatus 1 according to the fifth embodiment includes an IGBT current monitoring circuit 15. The IGBT current monitoring circuit 15 receives the terminal voltage of the sense resistor 23 according to the third embodiment to detect the sense current. Moreover, the IGBT current monitoring circuit 15 compares the detected sense current to the predetermined FET on-decision threshold current. Based on the comparison, the detected sense current is larger than or equal to the FET on-decision threshold current Ith, the IGBT current monitoring circuit 15 detects the situation in which the IGBT 20 is turned on and outputs an on-enabled signal to the FET gate driving circuit 13.

According to the waveform diagram in FIG. 3, the current flowing through the IGBT 20 increases in a large scale during the charging of capacitance between the gate and collector of the IGBT 20 by the gate voltage and during the gate voltage being constant. During this period, the IGBT 20 is shifted from an active region to a saturation region and the IGBT is still not completely turned off.

In fact, when the FET on-decision threshold current Ith is set to be a sufficiently large value, since it can already be determined that a larger current flows through the IGBT 20, an excessive current will not be conducted in the FET 30 even when the FET 30 is turned on during this timing.

In a situation where the FET is turned on after the IGBT 20 is switched into a saturation region and maintains at a constant state, for example, it may be configured to turn on the FET 30 after the elapse of the predetermined delay time defined according to the FET on-decision threshold current Ith from the detection of the current, which is larger than or equal to the FET on-decision threshold current Ith, flowing through the IGBT 20. To achieve the above-mentioned situation, the IGBT current monitoring circuit 15 may output an on-enabled signal after the elapse of the predetermined delay time defined according to the FET on-decision threshold current Ith from the detection of the current, which is larger than or equal to the FET on-decision threshold current Ith, flowing through the IGBT 20. Or alternatively, the FET gate driving circuit 13 may output the gate voltage to the FET 30 after the elapse of the predetermined delay time from the reception of the on-enabled signal.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A power transistor driving apparatus comprising:
   a field-effect type transistor;
   an insulated gate type bipolar transistor, which is connected to the field-effect type transistor in parallel;
   a first driving circuit that generates a first gate voltage to turn on the insulated gate type bipolar transistor, the first gate voltage applied to a gate of the insulated gate type bipolar transistor;
   a second driving circuit that adjusts a second gate voltage to turn on or to turn off the field-effect type transistor, the second gate voltage applied to a gate of the field-effect type transistor;
   a detection circuit that detects whether the insulated gate type bipolar transistor is turned on; and
   an overcurrent detection circuit that carries out an overcurrent detection based on a current flowing through the insulated gate type bipolar transistor, wherein:
   the second driving circuit outputs the second gate voltage to turn on the field-effect type transistor based on a condition in which the detection circuit detects that the insulated gate type bipolar transistor is turned on;
   the first driving circuit turns off the insulated gate type bipolar transistor in response to the overcurrent detection circuit detecting an overcurrent flowing through the insulated gate type bipolar transistor; and
   the second driving circuit turns off the field-effect type transistor in response to the overcurrent detection circuit detecting the overcurrent.

2. The power transistor driving apparatus according to claim 1, wherein:
   the detection circuit includes a voltage monitoring circuit, which monitors the first gate voltage applied to the gate of the insulated gate type bipolar transistor; and
   the voltage monitoring circuit detects that the insulated gate type bipolar transistor is turned on when the first gate voltage, which is equal to or larger than a predetermined voltage, is applied to the gate of the insulated gate type bipolar transistor.

3. The power transistor driving apparatus according to claim 2,
   wherein the predetermine voltage is set to reach a value of the second gate voltage after a state of the insulated gate type bipolar transistor is shifted to a saturation region.

4. The power transistor driving apparatus according to claim 2, further comprising:
   a temperature detector that detects a temperature of the insulated gate type bipolar transistor,
   wherein the voltage monitoring circuit changes the predetermined voltage in view of a temperature property of the insulated gate type bipolar transistor based on the temperature detected by the temperature detector.

5. The power transistor driving apparatus according to claim 1, wherein:
   the detection circuit includes a current monitoring circuit that monitors a current flowing through the insulated gate type bipolar transistor; and
   the current monitoring circuit detects that the insulated gate type bipolar transistor is turned on based on a situation in which the current monitoring circuit detects the current flowing through the insulated gate type bipolar transistor.

6. The power transistor driving apparatus according to claim 5,
   wherein the second driving circuit generates the second gate voltage after an elapse of a predetermined delay time from a situation where it is detected that a current larger than or equal to a predetermined current flows through the insulated gate type bipolar transistor, the second gate voltage configured to turn on the field-effect type transistor.

7. The power transistor driving apparatus according to claim 1,
   wherein the field-effect type transistor is configured by using a wide-bandgap semiconductor.

8. The power transistor driving apparatus according to claim 1, wherein:
   the first driving circuit, the second driving circuit and the detection circuit are integrated into one chip; and
   the one chip, the field-effect type transistor and the insulated gate type bipolar transistor mount on one circuit board.

9. The power transistor driving apparatus according to claim 1,
   wherein the first driving circuit outputs a signal to the detection circuit, and
   wherein the signal indicates a value of a voltage, which is applied to the gate of the insulated gate type bipolar transistor.

10. A power transistor driving apparatus comprising:
    a field-effect type transistor;
    an insulated gate type bipolar transistor connected to the field-effect type transistor in parallel, and having a main cell and a sense cell;
    a first driving circuit that generates a first gate voltage to turn on the insulated gate type bipolar transistor, the first gate voltage applied to a gate of the insulated gate type bipolar transistor;
    a second driving circuit that adjusts a second gate voltage to turn on or to turn off the field-effect type transistor, the second gate voltage applied to a gate of the field-effect type transistor;

a detection circuit that detects whether the insulated gate type bipolar transistor is turned on; and an overcurrent detection circuit that detects whether an overcurrent, which is larger than a rated current, flows between an emitter and a collector of the insulated gate type bipolar transistor based on a comparison result between a predetermined threshold value and a value of a current flowing through the sense cell, wherein:

the second driving circuit outputs the second gate voltage to turn on the field-effect type transistor based on a condition in which the detection circuit detects that the insulated gate type bipolar transistor is turned on;

the first driving circuit turns off the insulated gate type bipolar transistor in response to the overcurrent detection circuit detecting an overcurrent flowing through the insulated gate type bipolar transistor; and the second driving circuit turns off the field-effect type transistor in response to the overcurrent detection circuit detecting the overcurrent.

* * * * *